(12) United States Patent
Zong et al.

(10) Patent No.: US 8,496,158 B2
(45) Date of Patent: Jul. 30, 2013

(54) METHOD AND APPARATUS FOR MONITORING FREE AIR BALL (FAB) FORMATION IN WIRE BONDING

(75) Inventors: Fei Zong, Tianjin (CN); Guoliang Gong, Tianjin (CN); Meiquan Huang, Tianjin (CN); Hejin Liu, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/604,641

(22) Filed: Sep. 6, 2012

(65) Prior Publication Data
US 2013/0119114 A1 May 16, 2013

(30) Foreign Application Priority Data

Nov. 11, 2011 (CN) .......................... 2011 1 0356332

(51) Int. Cl.
*B23K 31/02* (2006.01)
(52) U.S. Cl.
USPC .......... 228/103; 228/4.5; 228/105; 228/180.5
(58) Field of Classification Search
None
See application file for complete search history.

(56) References Cited

U.S. PATENT DOCUMENTS

| | | | | |
|---|---|---|---|---|
| 5,110,032 A * | 5/1992 | Akiyama et al. | ............... | 228/102 |
| 5,176,310 A * | 1/1993 | Akiyama et al. | ........... | 228/180.5 |
| 5,581,632 A | 12/1996 | Koljonen | | |
| 5,640,199 A | 6/1997 | Garakani | | |
| 5,861,909 A | 1/1999 | Garakani | | |
| 6,273,321 B1 * | 8/2001 | Koduri | ........................... | 228/102 |
| 6,555,401 B2 | 4/2003 | Koduri | | |
| 6,772,511 B2 | 8/2004 | Nose | | |
| 7,624,904 B1 * | 12/2009 | Smith | ............. | 228/4.5 |
| 7,644,852 B2 * | 1/2010 | Nishiura et al. | ................... | 228/9 |
| 8,191,759 B2 * | 6/2012 | Tei et al. | ..................... | 228/180.5 |
| 2002/0145032 A1 * | 10/2002 | Khandros et al. | ............. | 228/155 |
| 2003/0006266 A1 * | 1/2003 | Wong et al. | ..................... | 228/4.5 |
| 2003/0178469 A1 * | 9/2003 | Hess et al. | ...................... | 228/103 |
| 2005/0133563 A1 * | 6/2005 | Kim et al. | ....................... | 228/4.5 |
| 2005/0212549 A1 * | 9/2005 | Matsubara et al. | ........... | 324/772 |
| 2005/0284914 A1 * | 12/2005 | Beatson et al. | ................ | 228/4.5 |
| 2008/0246133 A1 * | 10/2008 | Derderian | ...................... | 257/678 |
| 2010/0059574 A1 * | 3/2010 | Arahata et al. | ............. | 228/180.5 |
| 2010/0133322 A1 * | 6/2010 | Takahashi et al. | ............. | 228/102 |
| 2011/0000951 A1 * | 1/2011 | Qin | .............................. | 228/103 |
| 2011/0108959 A1 * | 5/2011 | Hembree | ....................... | 257/621 |
| 2012/0032350 A1 * | 2/2012 | Warren et al. | .................. | 257/782 |

FOREIGN PATENT DOCUMENTS

| | | | |
|---|---|---|---|
| JP | 02-129936 A | * | 5/1990 |
| JP | 05-235085 A | * | 10/1993 |
| JP | 2010-245249 A | * | 10/2010 |
| JP | 2012-099556 A | * | 5/2012 |

* cited by examiner

*Primary Examiner* — Kiley Stoner
(74) *Attorney, Agent, or Firm* — Charles Bergere

(57) ABSTRACT

A method for monitoring free air ball (FAB) formation during a wire bonding process includes attaching a dummy bond wire to an unused location on a first surface of a semiconductor chip carrier, extending the dummy bond wire a predetermined distance from the first surface such that a tip of the dummy bond wire is spaced from the first surface, and forming a dummy FAB at the tip of the bond wire. A profile of the dummy FAB is inspected with an imaging unit to identify any defects in the dummy FAB. An alarm is triggered and the wire bonding process is halted if the dummy FAB is defective so that bonding parameters may be adjusted. The wire bonding process is restarted after the bonding parameters have been adjusted.

15 Claims, 5 Drawing Sheets

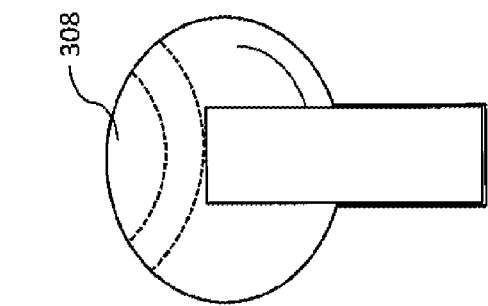
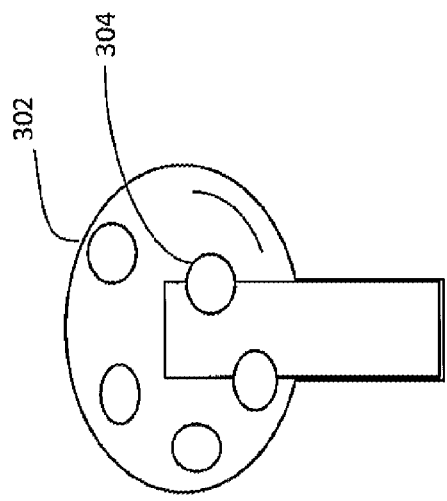
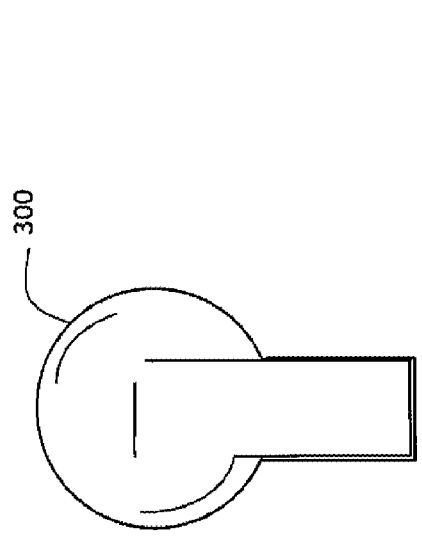

METHOD AND APPARATUS FOR MONITORING FREE AIR BALL (FAB) FORMATION IN WIRE BONDING

BACKGROUND OF THE INVENTION

The present invention relates to semiconductor device assembly, and more particularly, to a method and apparatus for monitoring free air ball (FAB) formation during wire bonding.

A semiconductor die is a small integrated circuit formed on a semiconductor wafer. The die is cut from the wafer and then attached to a substrate or semiconductor chip carrier. Bonding pads on the semiconductor die are electrically connected to electrical contacts on the carrier (also known as leads or lead fingers) using bond wires with wire bonding equipment. Wire bonding is a solid phase process that uses a combination of heat, pressure and ultrasonic energy to form a connection between a bond wire and the bonding pads and carrier leads.

In semiconductor device assembly of wire bond type devices, a wire is fed into a capillary of a wire bonding machine. Typically, a first, ball bond is used to attach a tip of the wire to a bonding pad on the die. The ball bond is formed by applying a high voltage electrical charge to the tip of the wire, which melts the tip such that a ball is formed at the tip. The ball is then welded to the die bond pad. The wire is then moved to one of the leads of the carrier and a second bond is formed to attach the other end of the wire to the lead of the chip carrier.

The ball formation process is achieved by ionization of an air gap by a process called electronic flame off (EFO). In EFO, electric heating discharge occurs between two electrodes: one electrode is the wire, typically Copper or Gold (anode) and the other electrode is a flat plate (cathode). The heat produced by an EFO probe during the discharge causes the wire electrode to melt and surface tension of the molten metal causes the metal to roll up into a ball shape. When a sufficient amount of the metal (wire) has melted, the discharge is terminated and the molten ball is allowed to solidify. The resulting ball is known as a free air ball (FAB). A suitable reducing agent, such as a forming gas (most commonly a mixture of hydrogen and nitrogen in an appropriate concentration) is used to minimize oxidation of the FAB, which is especially important if the wire is made of Copper.

FABS may suffer from defects and inconsistencies related to shape, size, roundness, roughness and brightness that arise due to variations in EFO parameters, such as the distance between the EFO probe and wire, rate of discharge of the forming gases, and timing of discharge of the forming gases. Incorrectly set EFO parameters result in bonding failures including formation of 'flower' balls, 'golf' balls, and bonding pad damage. These defects can play an important role in the overall IC production yield and cost. Defective FAB profiles can lead to defects or lower quality, which can cause a device to be rejected during post-production quality checks. Moreover, if a wire bonder produces defective FABS, the entire production batch may be rejected leading to high production costs and low yield. Therefore, monitoring and inspection of the FAB formation during the wire bonding process is desired to save time and cost.

In light of the foregoing, there is a need for monitoring FAB formation in a wire bonding process.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIGS. 3A, 3B, 3C and 3D show various FAB profiles;

DETAILED DESCRIPTION OF PREFERRED EMBODIMENTS

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method for monitoring free air ball (FAB) formation during a wire bonding process is provided. A dummy bond wire is attached to an unused location on a first surface of a semiconductor chip carrier. The dummy bond wire then is extended a predetermined distance from the first surface, preferably along an axis that is substantially perpendicular to the first surface, such that a tip of the dummy bond wire is spaced from the first surface. A dummy FAB is formed on the tip of the dummy bond wire. A profile of the dummy FAB then is inspected using an imaging unit to identify one or more defects in the dummy FAB. An alarm may be triggered and the wire bonding process stopped if one or more defects are identified in the dummy FAB. One or more wire bonding parameters then may be adjusted and the wire bonding process restarted.

In another embodiment of the present invention, an apparatus for monitoring FAB formation in a wire bonding process is provided. The apparatus includes a wire bonder, an imaging unit, and a processor. The wire bonder attaches a dummy bond wire to an unused location of a semiconductor chip carrier and then extends the dummy bond wire a predetermined distance from the unused location such that a tip of the dummy bond wire is spaced from the unused location. A dummy FAB is then formed on the tip of the dummy bond wire. The imaging unit inspects the profile of the dummy FAB and transmits image date to the processor. The processor analyzes the image data to determine if the dummy FAB is defective. If so, the processor can trigger an alarm signal indicating a defective dummy FAB. The processor also can halt the wire bonding process, adjust FAB formation parameters, and then restart the wire bonding process.

Various embodiments of the present invention provide a method and apparatus for monitoring FAB formation in a wire bonding process. The FAB monitoring is carried out in-situ, that is, during the wire bonding process. Thus, defective FAB formation is detected during the wire bonding process as opposed to post-production detection, leading to a significant increase in productivity and device yields. In various embodiments of the present invention, one or more bonding parameters are adjusted during the bonding process itself, thereby minimizing the possibility of the entire production batch being rejected. Finally, as a dummy FAB is formed at an unused location on the semiconductor chip carrier, actual bonding sites are not affected.

Figure 1:
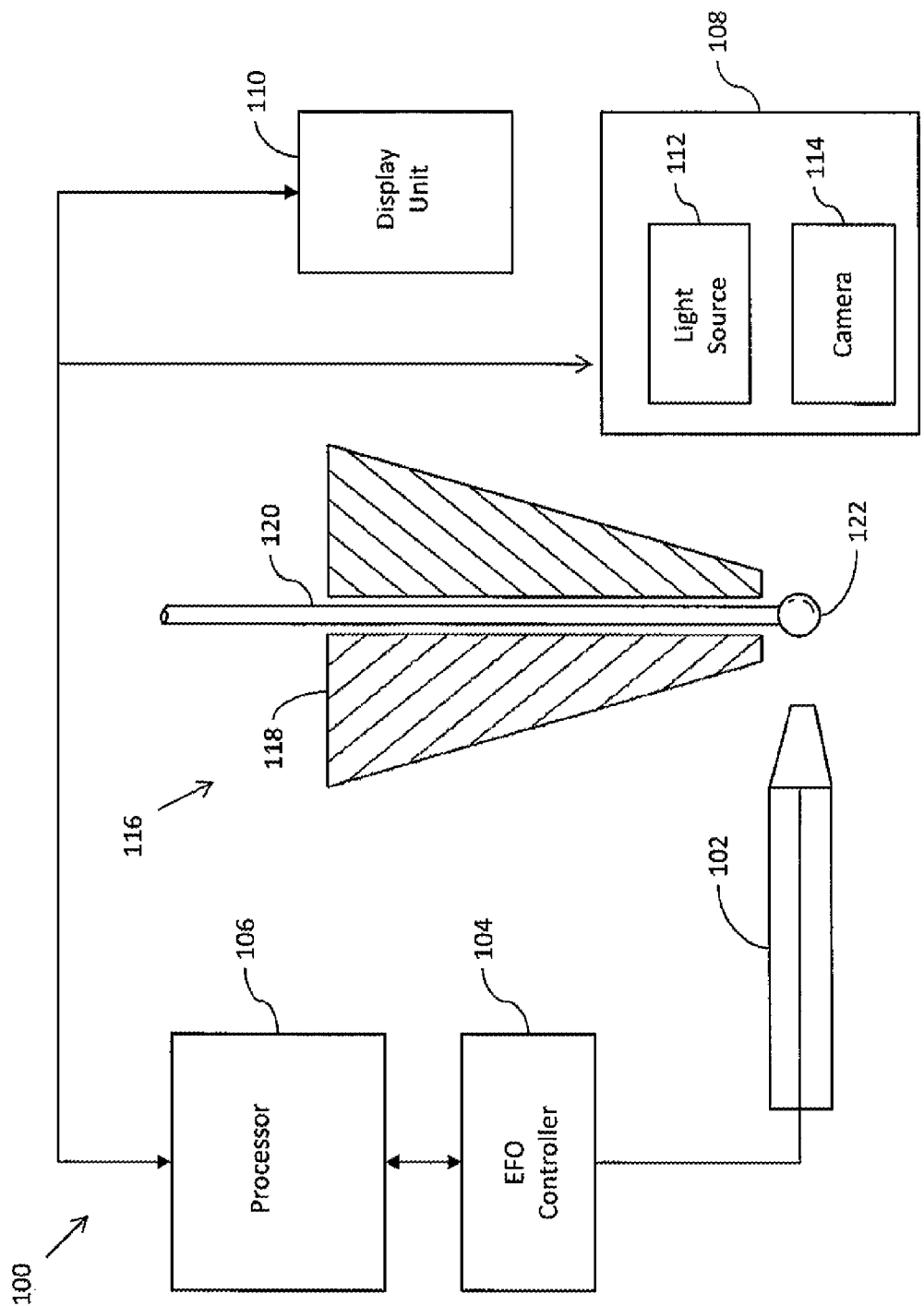
FIG. 1 is a schematic diagram of an apparatus for monitoring free air ball (FAB) formation in wire bonding in accordance with an embodiment of the present invention.

Referring now to FIG. 1, a schematic diagram of an apparatus 100 for monitoring free air ball (FAB) formation in a wire bonding process during assembly of a semiconductor device in accordance with various embodiments of the present invention is shown. The apparatus 100 includes an electronic flame-off (EFO) probe 102, an electronic flame-off (EFO) controller 104, a processor 106, an imaging unit 108, a display unit 110, and a wire bonder 116. The imaging unit 108 includes a light source 112 and a camera 114.

The wire bonder 116 includes a capillary 118. The top end of the capillary 118 is secured to a bonding head (not shown). At the bottom end of the bonding capillary 118, the EFO probe 102 is positioned a predetermined distance from the bottom tip of the capillary 118, in a horizontal XY-direction. The EFO probe, EFO controller 104 and capillary 118 are known in the art. A bond wire 120 is passed through the capillary 118 from the bonding head through the bottom of the capillary 118, in a vertically downward direction. The bond wire 120 may comprise various electrically conductive materials such as gold, aluminum, copper or a base metal with an alloy. However, the present invention is particularly suitable for copper wire bonding because copper wire is harder than gold wire. A FAB 122 is formed at the bottom tip of the bond wire 120 by an electrical discharge produced by the EFO probe 102, as is known in the art. The EFO parameters, such as the horizontal distance between the EFO probe 102 and capillary 118, rate of discharge of forming gases, timing of discharge of the forming gases and so forth, are set by the EFO controller 104. It should be noted that different FAB formation processes and numerous wire bonders, such as the wire bonder 116, are fairly well known in the art, therefore further additional details have been omitted from the present description so as not to obfuscate the invention.

In an embodiment of the present invention, the imaging unit 108 is located a predetermined distance from the bottom tip of the capillary 118 in a horizontal XY-plane so that it can acquire an image of the FAB 122 during the FAB monitoring process, discussed below. The imaging unit 108 may be attached to the wire bonder 116, if necessary, using an appropriate attachment arrangement. The capillary 118 is moved away from the FAB 122 at the time of monitoring. The light source 112 is appropriately focused on the FAB 122 in order to illuminate the FAB 122 so that a clear image of the FAB 122 may be acquired. The camera 114 takes a picture of the FAB 122 and transmits the image of the FAB 122 to the processor 106. The processor 106 processes the image of the FAB 122 to identify one or more defects in the profile of the FAB 122. The display unit 110 also is connected to the processor 106 and displays various images and information such as of the FAB 122, an alarm indication, etc.

In another embodiment of the present invention, the camera 114 is used along with a microscope (not shown), such as a scanning electron microscope (SEM) to magnify the image of the FAB 122. In yet another embodiment of the present invention, the imaging unit 108 includes the light source 112 and a microscope and the profile of the FAB 122 is visually inspected by a person. Further, in an embodiment of the present invention, the apparatus 100 may include an alarm generation unit (not shown) to generate an alarm upon detection of defective FAB profiles; for example, the processor 106 may include alarm generation logic (hardware and software).

Figure 2:
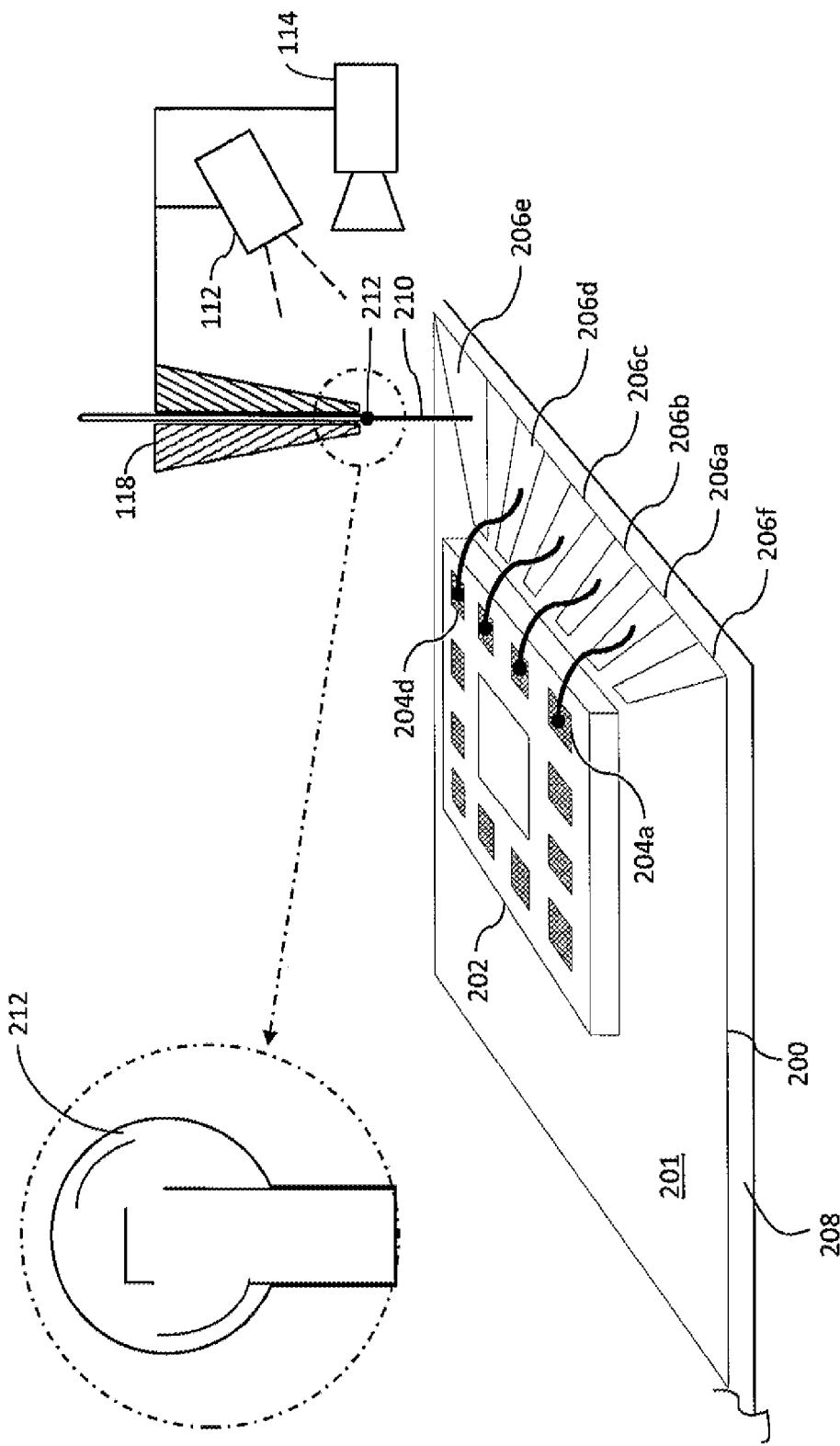
FIG. 2 is a schematic diagram depicting a dummy free air ball (FAB) formed on a semiconductor chip carrier in accordance with an embodiment of the present invention.

Referring now to FIG. 2, a schematic diagram depicting a dummy free air ball (FAB) 212 formed with the wire bonding apparatus 100 of FIG. 1 is shown. More particularly, FIG. 2 shows a semiconductor chip carrier 200, which in this embodiment is a lead frame, having a first surface 201 upon which a semiconductor die 202 is mounted. The semiconductor die 202 includes one or more bonding pads such as 204a and 204d (hereafter collectively referred to as bonding pads 204), as is known in the art. The semiconductor chip carrier 200 has one or more corresponding electrical contacts (also referred to as leads or lead fingers) 206a, 206b, 206c and 206d (hereafter collectively referred to as lead fingers 206) on the first surface 201, i.e. the top surface of the semiconductor chip carrier 200. In an exemplary embodiment as illustrated in FIG. 2, bond wires connect the die bonding pads 204 with corresponding ones of the lead fingers 206, as is known in the art. The semiconductor chip carrier 200 also has one or more locations that are not used for bond wires, such as unused leads 206e and 206f, and a tie bar 208. The wire bonding process, semiconductor chip carrier 200, and semiconductor die 202 are all well known in the art.

In accordance with the present invention, the wire bonder 116 attaches a dummy bond wire 210 to one of the unused locations of the chip carrier 200, such as the lead finger 206e, and then extends the dummy bond wire 210 a predetermined distance away from the first surface 201 of the chip carrier 200. The wire 210 preferably is extended along an axis generally perpendicular to the first surface 201 of the semiconductor chip carrier 200. It will be understood that while the wire 210 is preferably extended vertically, i.e. such that the dummy wire 210 is perpendicular to the first surface 201, this is not a requirement of the invention.

The wire bonder 116 then forms the dummy FAB 212 on a tip of the dummy wire 210 that is spaced from the first surface 201 of the chip carrier 200. After the dummy FAB 212 is formed, the bonding wire 120 is separated from the dummy FAB 122, as is known in the art, such as by clamps (not shown). In another embodiment of the present invention, the dummy wire 210 is extended from the surface 201 by a predetermined distance and then cut. A dummy cherry-pit FAB is then formed and planted on the tip of the dummy wire 210. An enlarged view of the dummy FAB 212 also is shown in FIG. 2.

After the capillary 118 is moved away from the dummy FAB 122, the dummy FAB 122 is illuminated by the light source 112 and an image of the dummy FAB 212 is obtained by the camera 114. The image is processed by the processor 106 to identify one or more defects in the profile of the dummy FAB 122.

A preferred or ideal FAB is generally spherical in shape and has a predetermined diameter and roughness characteristics, as is known in the art. However, due to the variations in EFO parameters and forming gases, the resulting FABS often contain defects. Referring now to FIGS. 3A-3D, various profiles of FABS are shown. FIG. 3A shows an ideal profile 300 that is perfectly round and meets predetermined roughness, brightness and diameter specifications. FIGS. 3B, 3C and 3D show various FAB profiles indicative of a defective or undesirable FAB. FIG. 3B shows a "golf ball" FAB 302, in which one or more dimples or small dents 304 are observed around the surface of the FAB 302. FIG. 3C shows an elongated FAB 306, i.e. the shape of the FAB 306 is not perfectly spherical. FIG. 3D shows another possible defective FAB profile 308, where one or more deformations or wrinkles 308 are disposed on the surface of the FAB. A number of other defects related to shape, size, roughness and brightness of a FAB also are known and may be characterized in order to identify defective or low quality FABS. The processor 106 compares the captured image data with such low quality FAB profile data to identify one or more defects in the dummy FAB 212. In one embodiment of the invention, if the dummy FAB 212 is determined to be defective, the processor 106 triggers or generates an alarm. The alarm may be acted upon manually by an operator to stop the wire bonding process, adjust FAB formation parameters, and then re-start the process, or such steps may be automated and performed by the apparatus 100 itself.

The present invention also provides a method for monitoring free air ball (FAB) formation during wire bonding process and identifying the defects in FABS.

Figure 4:
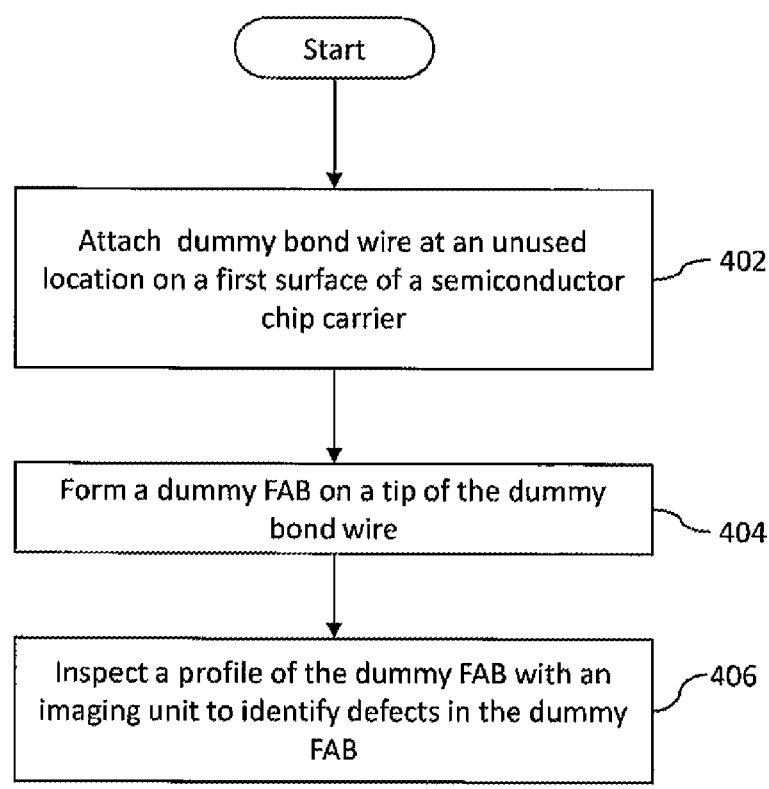
FIG. 4 is a flowchart illustrating a method for monitoring FAB formation in a wire bonding process in accordance with an embodiment of the present invention.

Referring now to FIG. 4, a flowchart illustrating a method for monitoring free air ball (FAB) formation in a wire bonding process in accordance with an embodiment of the present invention is shown. References will be made to FIGS. 1 and 2 while explaining FIG. 4. At step 402, a dummy bond wire 210 is attached at an unused location on a first surface of a semiconductor chip carrier 200, like an unused lead finger or a tie bar of a lead frame. The dummy bond wire 210 is then extended away from the surface 201 of the chip carrier 200 in order to space a tip of the dummy bond wire 210 from the surface of the chip carrier 200. In one embodiment, the dummy bond wire 210 extends substantially perpendicular to the first surface 201 of the chip carrier 200. The dummy bond wire 210 is extended away from the first surface 201 of the chip carrier 200 so that a good image of a dummy FAB may be obtained. Some of the factors to consider when determining the distance from the first surface 201 are wire diameter and package structure. For example, in one embodiment, the dummy FAB 212 is formed a distance of about 3-5 mils from the first surface 201 of the chip carrier 200. However, other distances may be suitable so long as the dummy bond wire 210 does touch other bond wires or extend so far that it would be extend beyond the final package molding compound and be exposed.

At step 404, a dummy FAB 212 is either formed or planted on a tip of the dummy bond wire 210 that is spaced from the surface 201 of the chip carrier 200. The dummy FAB 212 will presumably have the same size, shape and characteristics as FABS formed during a normal wire bonding process by the wire bonder because the parameters for FAB formation have been programmed into the wire bonding apparatus 100. Next, at step 406, the profile of the dummy FAB 212 is inspected using the imaging unit 108 to identify defects in the dummy FAB 212.

Figure 5:
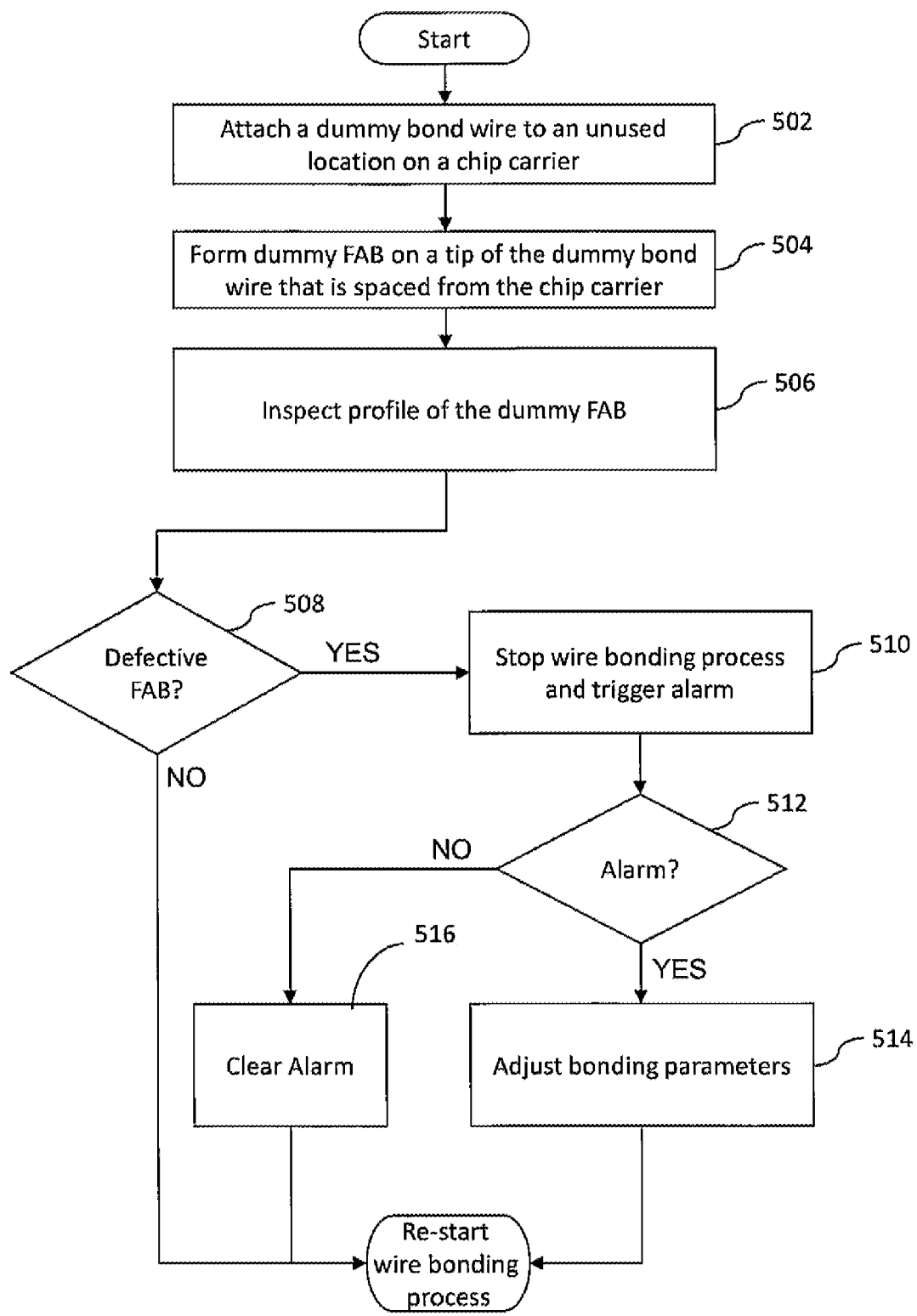
FIG. 5 is a more detailed flowchart illustrating a method for monitoring FAB formation in a wire bonding process in accordance with an embodiment of the present invention.

Referring now to FIG. 5, a flowchart illustrating a more detailed method for monitoring free air ball (FAB) formation in a wire bonding process in accordance with an embodiment of the present invention is shown. References will be made to FIGS. 1, 2 and 3 while discussing the steps shown in FIG. 5. Steps 502, 504 and 506 are similar to steps 402, 404 and 406 respectively of FIG. 4. At step 508, the processor 106 checks whether the profile of the dummy FAB 212 contains defects, as shown in FIG. 3.

If the profile of the FAB 212 contains defects, at step 510, the bonding process is temporarily stopped or halted and an alarm is triggered. The alarm indicates to an operator or to the processor 106 that the profile of the FAB 212 contains defects. At step 512, an operator can check the alarm to determine the cause and analyze the profile of the dummy FAB visually using a SEM. If the alarm is determined to be true, i.e., if the dummy FAB 212 contains defects, then the bonding parameters of the apparatus 100 are adjusted at step 514. If the alarm is false, it is cleared by the operator at step 516.

In an embodiment of the present invention, the method may be repeated at predetermined time intervals to monitor FAB formation throughout the wire bonding process. In another embodiment of the present invention, the process is repeated for each semiconductor device being assembled in a batch. Alternatively, the process may be repeated unit after formation of a predetermined number of wire bonds. It should be understood that the process can be repeated randomly or at any suitable frequency, depending on the requirements. For example, the process can be carried out once for every ten devices assembled. The frequency of monitoring may be set by the operator and accordingly, the processor 106 and wire bonder 116 are programmed accordingly. Also, it should be noted that the invention is equally applicable to both forward and reverse wire bonding processes.

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. It should be understood that, although the terms first, second, etc. and horizontal and vertical are used to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A method for monitoring free air ball (FAB) formation during assembly of a semiconductor device, the method comprising:
   attaching a dummy bond wire to an unused location on a first surface of a semiconductor chip carrier;
   forming a dummy FAB at a tip of the dummy bond wire; and
   inspecting a profile of the dummy FAB using an imaging unit to identify one or more defects in the dummy FAB.

2. The method of claim 1, further comprising the step of extending the dummy bond wire a predetermined distance from the unused location, along an axis that is substantially perpendicular to the first surface, such that the tip of the dummy bond wire is spaced from the unused location.

3. The method of claim 1, wherein the unused location comprises one of an unused signal lead, an unused ground lead and a tie bar of the semiconductor chip carrier.

4. The method of claim 1, wherein the dummy bond wire is formed of Copper.

5. The method of claim 1, wherein the imaging unit comprises at least one of a camera, a light source and a microscope.

6. The method of claim 1, further comprising halting the assembly process based on identification of the one or more defects.

7. The method of claim 6, further comprising:
adjusting one or more wire bonding parameters after halting the assembly process; and
restarting the assembly process using the adjusted parameters.

8. The method of claim 1, further comprising triggering an alarm based on identification of the one or more defects.

9. The method of claim 1, wherein the one or more defects comprise defects related to at least one of shape, size, roundness, roughness and brightness of the dummy FAB.

10. A method for monitoring free air ball (FAB) formation during assembly of a semiconductor device, the method comprising:
attaching a dummy bond wire to an unused location on a first surface of a semiconductor chip carrier;
extending the dummy bond wire a predetermined distance from the first surface such that a tip of the dummy bond wire is spaced from the unused location on the first surface;
forming a dummy FAB at the tip of the dummy bond wire; and
inspecting a profile of the dummy FAB using an imaging unit to identify one or more defects in the dummy FAB.

11. The method of claim 10, further comprising halting the assembly process based on identification of the one or more defects.

12. The method of claim 11, further comprising:
adjusting one or more wire bonding parameters after halting the assembly process; and
restarting the assembly process using the adjusted parameters.

13. The method of claim 10, further comprising triggering an alarm based on identification of the one or more defects.

14. The method of claim 10, wherein the dummy bond wire is extended along an axis that is substantially perpendicular to the first surface.

15. The method of claim 10, wherein
the unused location comprises one of an unused signal lead, an unused ground lead and a tie bar of the semiconductor chip carrier;
the dummy bond wire is formed of Copper; and
the imaging unit comprises at least one of a camera, a light source and a microscope.

* * * * *